(12) United States Patent
Ishida

(10) Patent No.: US 9,320,141 B2
(45) Date of Patent: Apr. 19, 2016

(54) WIRING STRUCTURE, CABLE, AND METHOD OF MANUFACTURING WIRING STRUCTURE

(75) Inventor: Hisashi Ishida, Tokyo (JP)

(73) Assignee: NEC Corporation, Tokyo (JP)

( * ) Notice: Subject to any disclaimer, the term of this patent is extended or adjusted under 35 U.S.C. 154(b) by 377 days.

(21) Appl. No.: 13/382,504

(22) PCT Filed: Apr. 28, 2010

(86) PCT No.: PCT/JP2010/003065
§ 371 (c)(1),
(2), (4) Date: Jan. 5, 2012

(87) PCT Pub. No.: WO2011/007486
PCT Pub. Date: Jan. 20, 2011

(65) Prior Publication Data
US 2012/0103683 A1    May 3, 2012

(30) Foreign Application Priority Data

Jul. 16, 2009    (JP) ................................. 2009-167587

(51) Int. Cl.
*H02G 3/00* (2006.01)
*H05K 1/03* (2006.01)
*H01B 7/04* (2006.01)
(Continued)

(52) U.S. Cl.
CPC *H05K 1/038* (2013.01); *H01B 7/04* (2013.01); *H01B 7/083* (2013.01); *H01B 7/17* (2013.01); *H05K 2201/029* (2013.01); *H05K 2201/10189* (2013.01); *H05K 2201/10287* (2013.01)

(58) Field of Classification Search
CPC .............. H01B 7/17; H01B 7/04; H01B 1/02; H01B 5/12
USPC ........ 174/70 R, 75 F, 89, 91, 104, 117 M, 24, 174/72 A, 117 F, 117 FF
See application file for complete search history.

(56) References Cited

U.S. PATENT DOCUMENTS 4,129,841 A * 12/1978 Hildebrand et al. .......... 333/237
4,375,009 A *  2/1983 Fearnside et al. ............... 174/36
(Continued)

FOREIGN PATENT DOCUMENTS

JP    63-318010 A    12/1988
JP    2001-177003 A    6/2001
(Continued)

OTHER PUBLICATIONS

International Search Report in PCT/JP2010/003065 dated Jun. 15, 2010 (English Translation Thereof).
(Continued)

*Primary Examiner* — Paresh Paghadal
(74) *Attorney, Agent, or Firm* — McGinn IP Law Group, PLLC

(57) ABSTRACT

The present invention provides a wiring structure that easily achieves a wiring part having a three-dimensional shape with high connection reliability and high signal quality. A wiring structure (10) according to the present invention includes one or a plurality of cables (18), a fiber (12) forming a mesh-like braiding fabric together with the cable (18), cable connectors (13, 17) formed at ends of the cable (18), and modules (14, 15) connected to the cable connectors (13, 17), the modules receiving or outputting signals through the cable.

19 Claims, 7 Drawing Sheets

(51) Int. Cl.
*H01B 7/17* (2006.01)
*H01B 7/08* (2006.01)

(56) References Cited

U.S. PATENT DOCUMENTS

| | | | |
|---|---|---|---|
| 5,902,956 A * | 5/1999 | Spies et al. | 174/358 |
| 6,674,008 B2 | 1/2004 | Nakamura | |
| 6,797,881 B2 | 9/2004 | Nakamura | |
| 7,595,452 B2 | 9/2009 | Kirstein et al. | |
| 2002/0155738 A1 * | 10/2002 | Ohsawa et al. | 439/98 |
| 2005/0081913 A1 * | 4/2005 | Ebbesen et al. | 136/291 |
| 2009/0025819 A1 | 1/2009 | Douglas | |
| 2013/0277083 A1 * | 10/2013 | Gauckler et al. | 174/24 |

FOREIGN PATENT DOCUMENTS

| | | | | |
|---|---|---|---|---|
| JP | 2005-080886 A | | 3/2005 | |
| JP | 2006-190495 A | | 7/2006 | |
| JP | 2006-196232 A | | 7/2006 | |
| JP | 2006196232 A | * | 7/2006 | ............ H01B 11/00 |
| JP | 2006-332647 A | | 12/2006 | |
| JP | 2006-351322 A | | 12/2006 | |
| JP | 2007-129039 A | | 5/2007 | |
| JP | 2009-139838 A | | 6/2009 | |
| JP | 2009-527119 A | | 7/2009 | |

OTHER PUBLICATIONS

Notification of Reason(s) for Refusal dated Nov. 26, 2013, with English translation.

* cited by examiner

WIRING STRUCTURE, CABLE, AND METHOD OF MANUFACTURING WIRING STRUCTURE

TECHNICAL FIELD

The present invention relates to a wiring structure, a cable, and a method of manufacturing the wiring structure, and more specifically, to a mounting structure of a wiring structure having a three-dimensional wiring structure, a cable, and a method of manufacturing the wiring structure used in electrical equipment including a mobile terminal, an information communication device or the like.

BACKGROUND ART

In electrical equipment represented by a mobile terminal and the like, an electrical circuit is formed using a printed wiring board. In recent years, there have been higher demands for compactness, lightness, and a variety of shapes of electrical equipment, and these demands have been stronger in the printed wiring board which is one of the component parts.

Regarding a related printed wiring board, there is a technique for curving a printed wiring board according to a curved surface shape as disclosed in Japanese Unexamined Patent Application Publication No. 2007-129039, titled "fluorine resin printed circuit board and manufacturing method thereof" (Patent literature 1), for example. The method of curving the printed wiring board includes a method of applying heat to a printed wiring board formed in a plate shape to curve the printed wiring board, and a method of press-molding the printed wiring board at a high temperature using a curved die.

FIG. 6 is a structural diagram showing a whole structure of a curved printed wiring board according to a related art. The printed wiring board as shown in FIG. 6 is a printed wiring board 21 formed by laminating metal foils 24 and a plurality of layers of prepreg (Prepreg: carbon sheet) 22, and has a curved shape obtained by pressing a prepreg laminated body 23 and metal foils 24 at a high temperature under the vacuum condition using a pair of curved dies.

CITATION LIST

Patent Literature

[Patent Literature 1]
Japanese Unexamined Patent Application Publication No. 2007-129039 (pages 3-4)

SUMMARY OF INVENTION

Technical Problem

However, the printed wiring board having a curved shape as in the related art shown in FIG. 6 has the following problems.

The first problem is occurrence of wiring disconnection, short-circuit, cracking of a printed wiring board due to the stress applied to the printed wiring board in the process of curving the printed wiring board. Such a problem becomes more serious with increasing size of the printed wiring board or increasing curving angle.

The present invention has been made in view of the problem, and aims to provide a wiring structure, a cable, and a method of manufacturing the wiring structure that are capable of dealing with compactness, lightness, and a variety of shapes without reducing connection reliability or signal quality.

Solution to Problem

In order to solve the above-mentioned problems, the wiring structure according to the present invention employs the following characteristic structures.

One exemplary aspect of a wiring structure according to the present invention includes (1) one or a plurality of cables; a fiber forming a mesh-like braiding fabric together with the cable; a cable connector formed at an end part of the cable; and a module connected to the cable connector, the module receiving or outputting a signal through the cable.

Advantageous Effects of Invention

According to a wiring structure, a cable, and a method of manufacturing the wiring structure of the present invention, the following advantageous effects can be attained.

The first advantageous effect is, by using the wiring structure according to the present invention, it is possible to deal with complicated shapes. Further, the cable wiring having a predetermined marginal length follows external factors including vibration and expansion and contraction of the wiring structure, thereby capable of manufacturing the wiring structure having a desired three-dimensional shape with high wiring connection reliability.

DESCRIPTION OF EMBODIMENTS

Hereinafter, preferred exemplary embodiments of a wiring structure, a cable, and a method of manufacturing the wiring structure according to the present invention will be described with reference to accompanying drawings. The present invention relates to a wiring structure with wiring having a three-dimensional structure. The wiring structure is applicable to any electrical equipment.

Features of the Present Invention

Prior to the description of the exemplary embodiments of the present invention, the outline of the features of the present invention will be described first. A wiring structure according to the present invention includes a three-dimensional structure including one or a plurality of cables, a fiber organized by the cable and a mesh, a cable connector formed at an end of the cable, and a plurality of modules connected to the cable connector. The term "fiber" here means a fiber that is used for clothes or the like, and more specifically, may be various fibers including synthetic fiber (e.g., polyester synthetic fiber, polyamide synthetic fiber), semi-synthetic fiber, regenerated fiber, inorganic fiber, and natural fiber. Further, the fiber obtained by synthesizing two or more fibers of them may be used.

The cable includes, in a sheath, one or more cable holding parts for holding another cable, and one or more fiber holding parts for holding the fiber. The cable holding part and the fiber holding part are formed in the sheath of the cable at predetermined intervals in order to secure both of a cable allowable bending radius and a marginal cable length when the cable and the fiber are organized by a mesh. Further, the signal connection between modules mounted on the wiring structure is performed through the cable.

Further, the cable is adapted to form the whole braiding fabric by forming the mesh so as to relay the fiber or by forming the mesh together with the fiber.

The cable may be a single-core cable, a multi-core cable, a coaxial cable, an optical cable, and the like, and it is possible to select the kind of the cable that is employed as desired according to the signal characteristics used in the wiring structure.

The cable and the fiber may be braided by hand or by a braiding machine, and a predetermined three-dimensional shape can be achieved by a braiding process.

Furthermore, by integrally processing the surface of the wiring structure that is three-dimensionally formed using resin or the like, the wiring structure has rigidity (robustness).

Application

By using the wiring structure according to the present invention having the features described above, a signal wiring part with a complicated shape that is required for electrical equipment including a mobile terminal device or a wearable appliance can be easily formed. Furthermore, when the electrical equipment is discarded, the wiring structure can be easily remanufactured.

Structural Example of First Exemplary Embodiment of the Present Invention

Figure 1A:
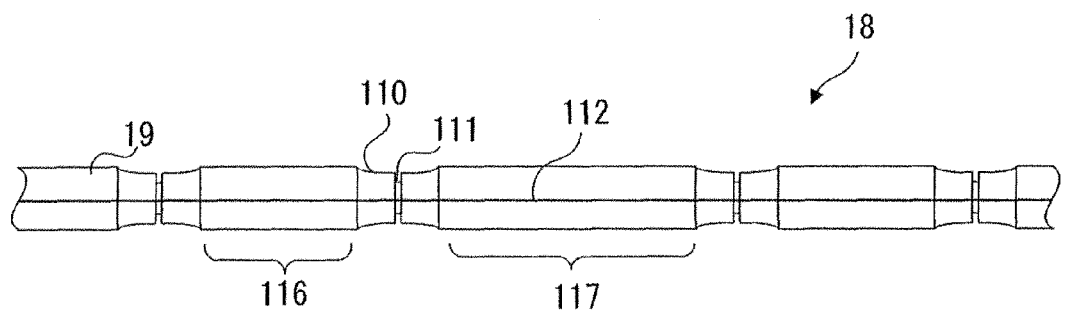
FIG. 1A is a structural diagram describing a first exemplary embodiment of a wiring structure of the present invention.
Figure 1B:
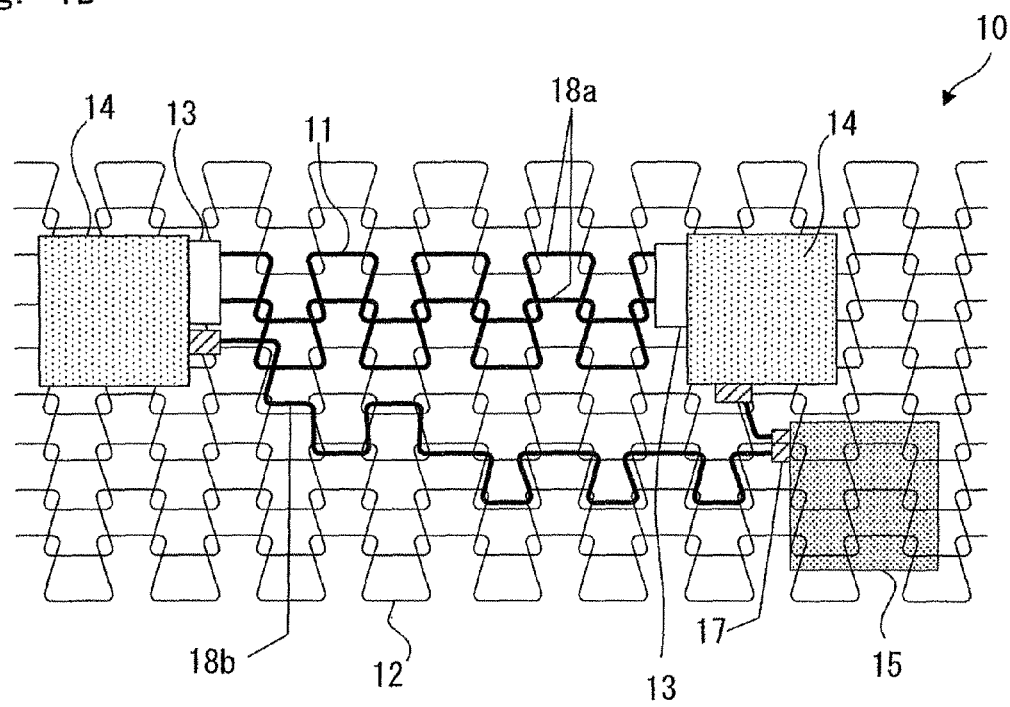
FIG. 1B is a structural diagram describing the first exemplary embodiment of the wiring structure of the present invention.
Figure 1C:
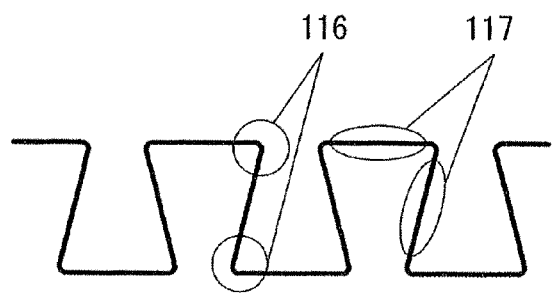
FIG. 1C is a structural diagram describing the first exemplary embodiment of the wiring structure of the present invention.
Figure 1D:
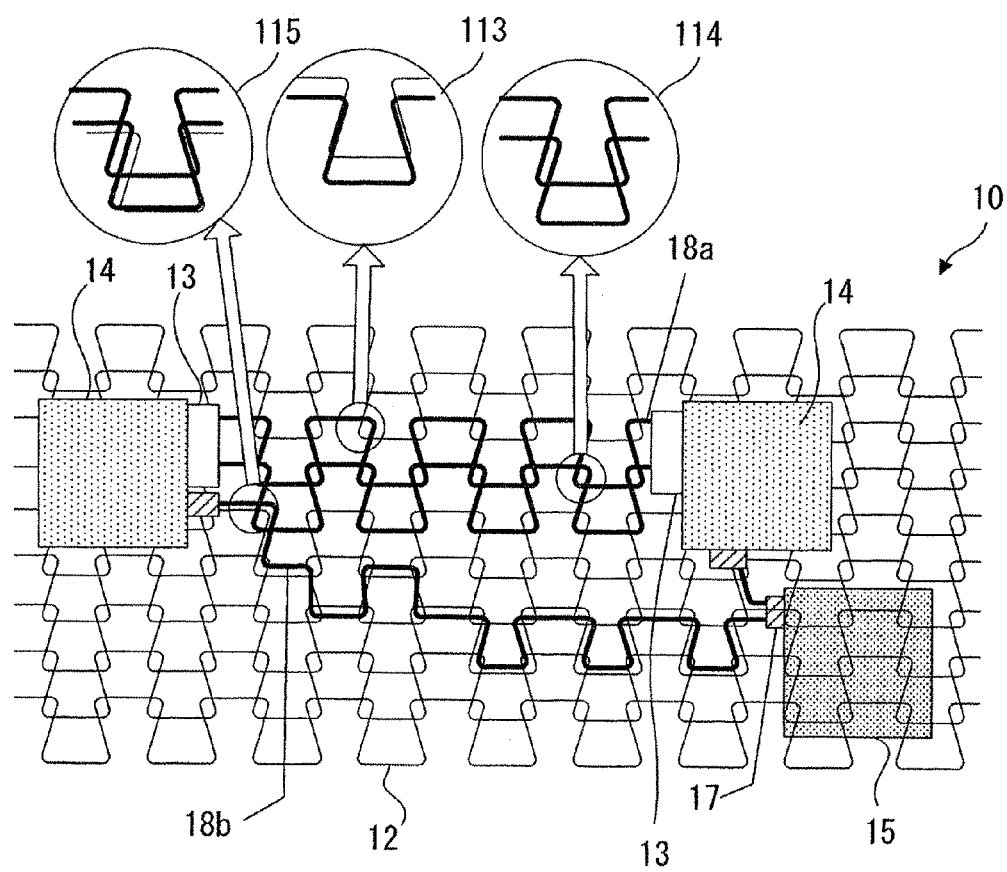
FIG. 1D is a structural diagram describing the first exemplary embodiment of the wiring structure of the present invention.

Next, one example of structures according to an exemplary embodiment of the present invention will be described in detail with reference to the drawings. FIGS. 1A to 1D are structural diagrams describing a first exemplary embodiment of a wiring structure of the present invention. FIG. 1A is a cross-sectional view of a cable forming the wiring structure of the first exemplary embodiment of the present invention, and FIG. 1B is a top view showing a top side of the wiring structure of the first exemplary embodiment of the present invention. Further, FIG. 1C is a diagram showing an enlarged view of one of cables forming the wiring structure shown in FIG. 1B, and FIG. 1D is a diagram showing enlarged views of a connection part of a cable and a fiber, a connection part of cables, and a connection part of a cable, a duplicated cable, and a fiber in the top view shown in FIG. 1C.

In FIG. 1A, a cable 18 is a single-core cable including a core wire 112 formed of an electric wire, and a sheath 19 forming an outer periphery of the core wire 112. In the sheath 19, one or a plurality of cable holding parts 110 are formed at predetermined intervals. Further, a fiber holding part 111 is formed in the center of each cable holding part 110. The cable holding parts 110 and the fiber holding parts 111 are formed at predetermined pitches in the same place.

The cable holding parts 110 are fit each other when being engaged with another cable 18, thereby clamping the cables 18 each other. Further, when the cable 18 and a fiber 12 (shown in FIG. 1B) are engaged, the fiber 12 enters (bites into) the fiber holding part 111. In this way, the fiber holding part 111 is capable of controlling the contact position between the cable 18 and the fiber 12, thereby clamping the fiber 12 into the cable 18.

Further, as shown in FIG. 1A, the cable 18 includes a cable allowable bending radius securing part 116 and a marginal cable length securing part 117. The cable allowable bending radius securing parts 116 and the marginal cable length securing parts 117 are alternately arranged. The cable holding part (fiber holding part 111) is arranged between the cable allowable bending radius securing part 116 and the marginal cable length securing part 117. Although the cable allowable bending radius securing part 116 is formed to be shorter than the marginal cable length securing part 117 in FIG. 1A, the lengths of the cable allowable bending radius securing part 116 and the cable marginal length securing part 117 can be made as desired.

Furthermore, as shown in the top view of the wiring structure in FIG. 1B, a wiring structure 10 according to the first exemplary embodiment is organized in a mesh shape by braiding the cables 18 shown in FIG. 1A and the fibers 12. The cables 18 and the fibers 12 that are organized are called a braiding fabric. In FIG. 1B, among the lines forming the braiding fabric, the thick lines show the cables 18 (18a, 18b) as shown in FIG. 1A, and the thin lines show the fibers 12. The cables 18 and the fibers 12 are flexed in substantially the same wave shape, and are braided so that the adjacent cables 18 and the fibers 12 are alternately engaged.

As shown in FIG. 1C, the cable 18 is bent in the cable allowable bending radius securing parts 116, thereby the whole cable 18 being flexed in a wave shape. In other words, the cable 18 is flexed to curve in a predetermined way in the cable allowable bending radius securing parts 116 and to be made linear in the marginal cable length securing parts 117. The cable 18 is organized as a braiding fabric while being flexed.

As shown in FIG. 1B, the cable 18 may be engaged with the wiring structure 10 in two different ways. In FIG. 1B, a cable engaged by the first method is shown as the first cable 18a, and a cable engaged by the second method is shown as the second cable 18b. Only the difference between the first cable 18a and the second cable 18b is the way of engagement with the wiring structure 10, and the structure of the cable is the same to the structure shown in FIG. 1A.

The first cable 18a of the cable 18 forms a mesh by the cable itself by way of the fiber 12 for organization. In other words, the first cable 18a forms one mesh of the wiring structure 10 by one cable (single cable). The first cable 18a can be arranged as shown in FIG. 1B by braiding the first cable 18a into the fiber 12 in place of a part of the fiber 12. Alternatively, the first cable 18a can be arranged as shown in FIG. 1B by removing a part of the mesh structure braided by the fiber 12 and arranging the braided first cable 18a in the removed area.

On the other hand, the second cable 18b of the cable 18 forms a mesh in parallel with the fiber 12 for organization. In other words, the second cable 18b together with the fiber 12 (second cable 18b and fiber 12 in double) forms one mesh of the wiring structure 10. The second cable 18b can be arranged as shown in FIG. 1B by being braided with the fiber 12 (in double). Alternatively, the second cable 18b can be arranged as shown in FIG. 1B by further braiding the second cable 18b into a part of the mesh structure of the fiber 12 that is previously braided. The engagement method of duplicating the second cable 18b and the fiber 12 is preferably applied to an area where the tension strength of the cable 18 is low.

As shown in FIG. 1D, in a connection part 114 where the cables 18 are engaged, the cable holding parts 110 formed in the sheaths 19 of the cables 18 fit. Further, in a connection part 113 where the cable 18 engages with the fiber 12, the fiber 12 and the fiber holding part 111 formed in the sheath 19 fit. Furthermore, in a connection part 115 where the first cable 18a, the duplicated second cable 18b, and the fiber 12 are engaged, the cable holding part 110 of the second cable 18b and the cable holding part 110 of the first cable 18a formed in the sheath 19 fit. Furthermore, in the connection part 115, the fiber 12 and the fiber holding part 111 in the cable holding part 110 of the first cable 18a fit.

Furthermore, as described above, as shown in FIG. 1C, the cable allowable bending radius securing part 116 secures a predetermined cable bending radius, and the marginal cable length securing part 117 secures a predetermined marginal cable length (linear part).

In typical, the thinner and the softer the cable is, the narrower the intervals of the cable holding parts 110 is and the smaller the mesh size is.

As described above, in the first exemplary embodiment, the shape of the wiring structure 10 can be varied in a desired form by braiding the cable 18 into the fiber 12 whose shape can be variously changed. Further, since the fiber 12 can be easily deformed, it is possible to reduce the internal stress occurred when the wiring structure 10 is deformed. This can prevent occurrence of wiring disconnection, short-circuit, cracking of a printed wiring board, or the like that is occurred in a conventional rigid wiring substrate.

Furthermore, in the first exemplary embodiment, by providing the fiber holding part 111 in the sheath 19 of the cable 18, the cable 18 and the fiber 12 of the wiring structure 10 can be engaged in a predetermined position. Accordingly, even when the position of the mesh between the cable 18 and the fiber 12 is temporarily deviated, it can be easily restored to the original shape. Furthermore, in the first exemplary embodiment, the cable holding part 110 is provided in the sheath 19 of the cable 18, which makes it possible to engage the cables 18 in a predetermined position.

Further, in the first exemplary embodiment, the cable allowable bending radius securing part 116 is provided, which makes it possible to secure a predetermined cable bending radius. Further, in the first exemplary embodiment, by arranging the marginal cable length securing parts 117 at predetermined intervals, a predetermined marginal length that allows the cable 18 to move can be given to the cable 18 itself organized by being braided in a mesh shape. This can allow the cable 18 to follow shrinkage or vibration occurred in the wiring structure 10.

Further, since the cable 18 has the mesh with regular patterns, the strength of the wiring structure 10 can be kept high, and satisfactory appearance of the wiring structure 10 can be maintained.

A cable connector is formed at an end of the cable 18 that is organized. The cable connector can be arranged in both surfaces of the braiding fabric. Further, a module can be arranged in the braiding fabric by duplicating the braiding fabric. In FIG. 1B, a first cable connector 13 is arranged in the side of the front surface and a second cable connector 17 is arranged in the rear surface. The modules including electric circuit parts are connected to the first cable connector 13 and the second cable connector 17. The module connected to the first cable connector 13 in the side of the front surface of the braiding fabric is a front surface module 14. Meanwhile, the module connected to the cable connector 17 in the side of the rear surface of the braiding fabric is a rear surface module 15. The method of fixing the module includes a method of attaching the module to the braiding fabric with adhesive, and a method of pressing and fixing the module by covering the outer peripheral part of the module with the fiber 12.

A plurality of modules may be mounted in the wiring structure 10, and the electrical connection between the modules is performed by the cable 18 that is organized with mesh. The cable 18 that is braided may include a single-core cable, a multi-core cable, a coaxial cable, and an optical cable, and in each kind of cables, the sizes and the pitches of the cable holding part 110 and the fiber holding part 111 formed in the sheath 19 can be controlled. Further, the type or the length of the cable 18 can be selected as desired according to the signal characteristics used in the wiring structure 10. Further, the material, the type, and the thickness of the fiber 12 that is braided can be selected as desired in consideration of at least a shrinkage ratio, texture, environmental resistance or the like required in the wiring structure 10. Further, the cable 18 and the fiber 12 may be braided by hand or by using a braiding machine. A predetermined three-dimensional shape is achieved by a braiding process.

A complicated shape of the wiring structure 10 may be achieved according to the way of braiding the cable 18. In this way, by using the wiring structure 10 according to the first exemplary embodiment, a wiring structure having a complicated shape can be constructed, and a wiring part with complicated shape required in electrical equipment including a curved surface case or a wearable appliance can be easily formed. Further, when the electrical equipment is discarded, the cable 18 and the fiber 12 forming the wiring structure 10 are raveled, thereby capable of easily reusing the cable 18 and the fiber 12.

Structural Example of Second Exemplary Embodiment of the Present Invention

Figure 2A:
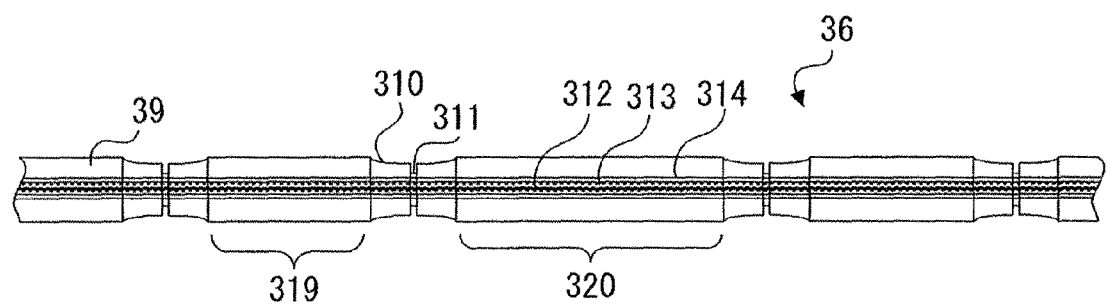
FIG. 2A is a structural diagram describing a second exemplary embodiment of the wiring structure of the present invention.
Figure 2B:
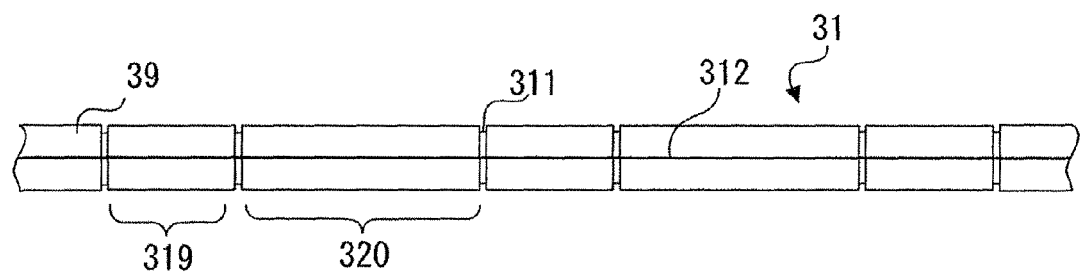
FIG. 2B is a structural diagram describing the second exemplary embodiment of the wiring structure of the present invention.
Figure 2C:
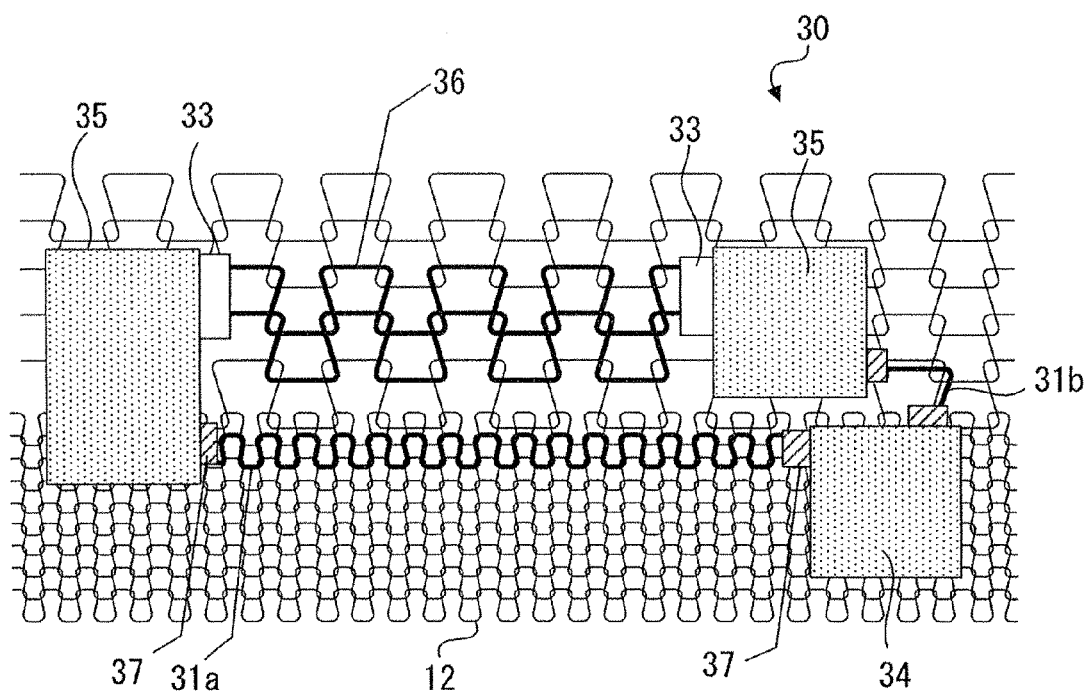
FIG. 2C is a structural diagram describing the second exemplary embodiment of the wiring structure of the present invention.
Figure 2D:
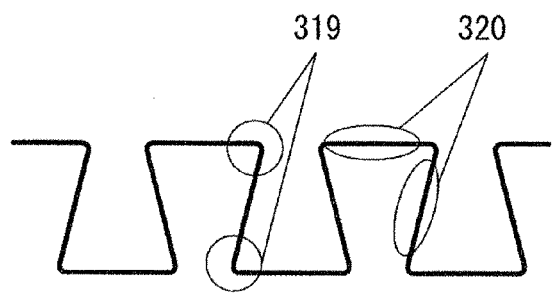
FIG. 2D is a structural diagram describing the second exemplary embodiment of the wiring structure of the present invention.
Figure 2E:
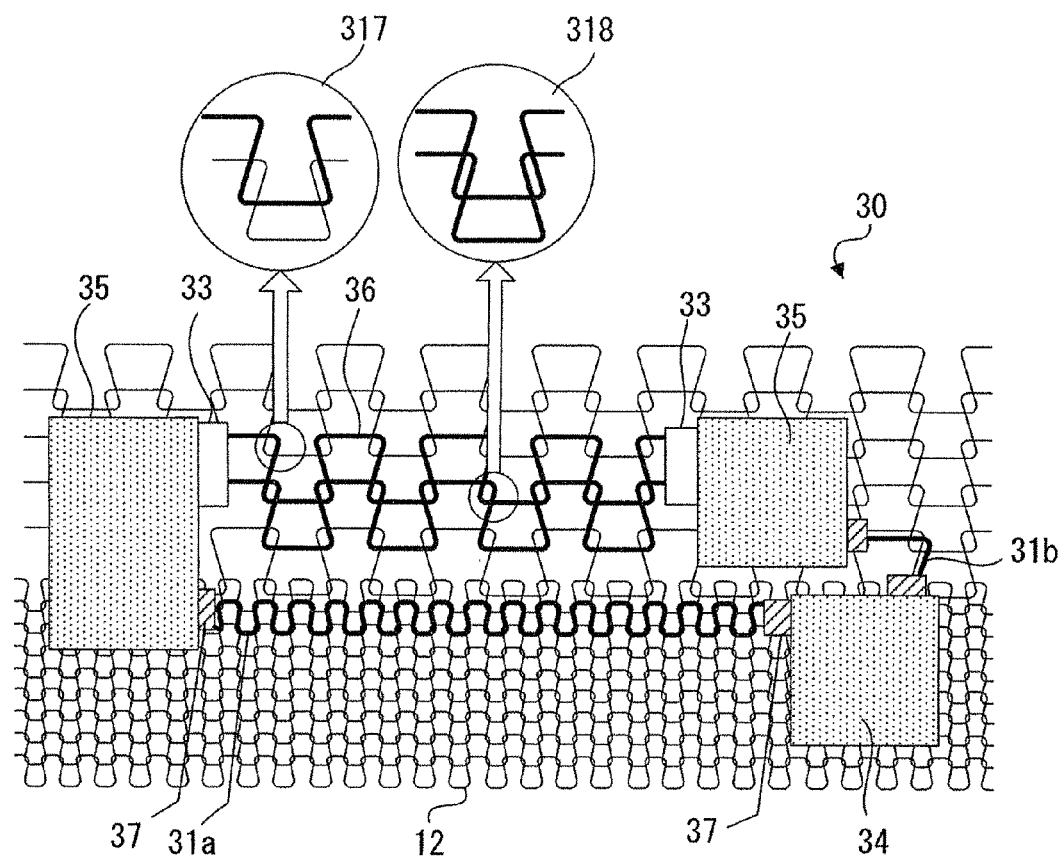
FIG. 2E is a structural diagram describing the second exemplary embodiment of the wiring structure of the present invention.

Next, another example of a structure according to a second exemplary embodiment of the present invention that is different from that shown in FIGS. 1A to 1D will be described in detail as the second exemplary embodiment of the present invention. FIGS. 2A to 2E are structural diagrams describing the second exemplary embodiment of a wiring structure according to the present invention. FIG. 2A is a cross-sectional view of a signal cable forming the wiring structure according to the second exemplary embodiment of the present invention, FIG. 2B is a cross-sectional view of a power supply cable forming the wiring structure according to the second exemplary embodiment of the present invention, and FIG. 2C is a top view showing a top side of the wiring structure according to the second exemplary embodiment of the present invention. Further, FIG. 2D is a diagram showing an enlarged view of one of cables forming the wiring structure shown in FIG. 2C, and FIG. 2E is a diagram showing enlarged views of a connection part of a cable and a fiber, and a connection part of cables in the top view shown in FIG. 2C.

One of the features in the second exemplary embodiment is that two kinds of cables of a signal cable 36 and a power supply cable 31 are arranged in a wiring structure 30. Further, in the second exemplary embodiment, as shown in FIG. 2C, the mesh size of a fiber 12 where the signal cable 36 is arranged is formed to be larger than that of the fiber 12 where the power supply cable 31 is arranged. In other words, one of the features in the second exemplary embodiment is that the mesh size of the fiber 12 is changed as desired according to the type or the material of the cable that is provided.

In FIG. 2A, the signal cable 36 is a coaxial cable including a core wire 312 formed of an electric wire, a dielectric layer 313 formed in the outer periphery of the core wire 312, a shield layer 314 formed in the outer periphery of the dielectric layer 313, and a sheath 39 formed in the outer periphery of the shield layer 314. One or a plurality of cable holding parts 310 are formed in the sheath 39 at predetermined intervals. A fiber holding part 311 is formed in each of the cable holding parts 310, and both of the fiber holding parts 311 and the cable holding parts 310 are formed at predetermined pitches in the same place. The cable holding parts 310 are fit each other when being engaged with another signal cable 36, thereby clamping the signal cables 36 each other.

Further, when the signal cable 36 and the fiber 12 (shown in FIG. 2C) are engaged, the fiber 12 enters (bites into) the fiber holding part 311. In this way, the fiber holding part 311 is capable of controlling the contact position between the signal cable 36 and the fiber 12, thereby clamping the fiber 12 into the signal cable 36. Further, the signal cable 36 includes a cable allowable bending radius securing part 319 and a marginal cable length securing part 320. The cable holding parts 310 and the fiber holding parts 311 are formed on the sheath 39 of the signal cable 36 at predetermined pitches in order to secure both of the marginal cable length after the organization and the cable allowable bending radius by the cable allowable bending radius securing part 319 and the marginal cable length securing part 320.

Further, as shown in the cross-sectional view of the power supply cable in FIG. 2B, the power supply cable 31 is a single-core cable including a core wire 312 formed of an electric wire, and a sheath 39 formed in the outer periphery of the core wire 312. In the sheath 39, a plurality of fiber holding parts 311 are formed at predetermined intervals.

When the power supply cable 31 and the fiber 12 (shown in FIG. 2C) are engaged, the fiber 12 enters (bites into) the fiber holding part 311. In this way, the fiber holding part 311 shown in FIG. 2B is capable of controlling the contact position between the power supply cable 31 and the fiber 12, thereby clamping the fiber 12 into the power supply cable 31. Further, the power supply cable 31 includes a cable allowable bending radius securing part 319 and a marginal cable length securing part 320. The fiber holding parts 311 are formed on the sheath 39 of the power supply cable 31 at predetermined pitches in order to secure both of the marginal cable length after the organization and the cable allowable bending radius by the cable allowable bending radius securing part 319 and the marginal cable length securing part 320. As shown in FIG. 2D, the cable allowable bending radius securing part 319 is folded in a curved shape and the marginal cable length securing part 320 is a linear part when the cable is folded.

As shown in FIG. 2C, the wiring structure 30 according to the second exemplary embodiment is separated into two areas having different mesh sizes. Specifically, the wiring structure 30 according to the second exemplary embodiment is formed so that the mesh size of the fabric in the upper half part in FIG. 2C in which the signal cable 36 is arranged differs from the mesh size of the braiding fabric in the lower half part in FIG. 2C in which a power supply cable 31b is provided. More specifically, the mesh size of the braiding fabric in the upper half part in FIG. 2C is configured to be larger than the mesh size of the fabric in the lower half part in FIG. 2C. In this way, the wiring structure 30 can be formed by combining the areas having different mesh sizes. Note that the mesh size can be selected as desired according to the type or the material of the cable that is arranged.

As shown in FIG. 2C, the wiring structure 30 is formed by braiding the power supply cables 31 (31a, 31b), a signal cable 36, and a fiber 12 into the wiring structure 30 for organization. There are two kinds of methods for engaging the power supply cable 31 with the wiring structure 30: the first power supply cable 31a and the second power supply cable 31b. The first power supply cable 31a shown in FIG. 2C of the power supply cable 31 forms a mesh by the cable itself by way of the fiber 12 for organization. In other words, the first power supply cable 31a forms one mesh of the wiring structure 10 by one cable (single cable). Further, the second power supply cable 31b shown in FIG. 2C of the power supply cable 31 forms a mesh in parallel with the fiber 12 for organization. In other words, the second cable 31b and the fiber 12 (in double) form one mesh of the wiring structure 10. The second power supply cable 31b is a structure used when the tension strength of the cable is low.

As shown in FIG. 2E, in a connection part 318 of the single cables 36, the cable holding parts 310 formed in the sheath 39 of the signal cable 36 fit each other. Further, in a connection part 317 where the signal cable 36 engages with the fiber 12, the fiber 12 and the fiber holding part 319 formed in the sheath 39 fit each other. The cable allowable bending radius securing part 319 is formed to secure a predetermined cable bending radius, and the marginal cable length securing part 320 is formed to secure a predetermined marginal cable length.

As described above, according to the second exemplary embodiment, as is similar to the first exemplary embodiment, the cable holding part 310 and the fiber holding part 311 are provided in the sheath 39 of the signal cable 36, and the cable holding parts 310 and the fiber holding parts 311 of the signal cable 36 are arranged at predetermined pitches. Further, in the second exemplary embodiment, as is similar to the first exemplary embodiment, a predetermined cable bending radius is secured by providing the cable allowable bending radius securing part 319. At the same time, by providing the marginal cable length securing part 320, a predetermined marginal length can be given to the signal cable 36 itself that is organized. As a result, the shape of the wiring structure 10 can be varied according to shrinkage or vibration of the wiring structure 30.

Furthermore, even when the position of the mesh between the signal cables 36 or between the signal cable 36 and the fiber 12 is deviated, the deformed shape can be easily restored to the original mesh shape due to the existence of the cable holding part 310 and the fiber holding part 311. Further, since the signal cable 36 has the mesh with regular patterns, the strength of the wiring structure 30 can be kept high and satisfactory appearance of the wiring structure 30 can be maintained.

Furthermore, in the second exemplary embodiment, as shown in FIG. 2C, two kinds of mesh sizes are achieved in the side of the signal cable 36 and the side of the power supply cable 31. In this way, the wiring structure 30 can be formed by combining the areas of two or more different mesh sizes according to the type of the cable that is arranged. Note that, the area having the different mesh sizes can be applied not only between the signal cable 36 and the power supply cable 31 as shown in FIG. 2C but also between any kind of cables. Further, the mesh size of the fiber may have the same mesh size. Further, the variation of the mesh sizes is not limited to two kinds of mesh sizes as shown in FIG. 2C. The wiring structure 30 can be formed with three or more kinds of mesh sizes. In FIG. 2C, thin, soft, and small mesh size can be achieved in the side of the power supply cable 31. As the mesh size is smaller, it is possible to finely deal with the expansion and contraction of the wiring structure 30.

A signal cable connector 33 is formed at an end part of the signal cable 36 that is organized. Further, a power supply cable connector 37 is formed at an end of each of the first power supply cable 31a and a second power supply cable 38 that are organized. Various types of modules including electric circuit parts are connected to the signal cable connector 33 and the power supply cable connector 37. A power supply module 34 serves to supply electric power to a function module 35 thorough the power supply cable 31. Further, a function module 35 receives electric power from the power supply module 34 through the power supply cable 31, and performs signal connection between the function modules 35 through the signal cable 36. Each module is fixed by being attached to the braiding fabric using adhesive or the like, or by being pressed by covering the outer peripheral part of the module by the fiber 12.

The signal cable 36 and the power supply cable 31 may be a single-core cable, a multi-core cable, a coaxial cable, an optical cable or the like. In each type of cables, the pitches or the sizes of the cable holding part 310 and the fiber holding part 311 formed in the sheath 39 can be designed as desired. Further, the type or the length of the cable holding part 310 or the fiber holding part 311 can be selected as desired according to the signal characteristics used in the wiring structure 30. Further, the material, the type, and the thickness of the fiber 12 that is braided can be selected as desired in consideration of at least a shrinkage ratio, texture, environmental resistance or the like required in the wiring structure 10. Further, the signal cable 36, the power supply cable 31, and the fiber 12 may be braided by hand or by using a braiding machine. A predetermined three-dimensional shape is achieved by such a braiding process.

The wiring structure 30 can achieve complicated shapes according to the way of braiding the signal cable 36 or the power supply cable 31. By using the wiring structure 30 according to the second exemplary embodiment, a wiring structure having a complicated shape can be constructed, thereby capable of easily forming a wiring part with complicated shape required in electrical equipment or the like including a wearable appliance or a curved surface case. Further, when the electrical equipment is discarded, the signal cable 36, the power supply cable 31, and the fiber 12 forming the wiring structure 30 are raveled, thereby capable of easily reusing the signal cable 36, the power supply cable 31, and the fiber 12.

Structural Example of Third Exemplary Embodiment of the Present Invention

Figure 3:
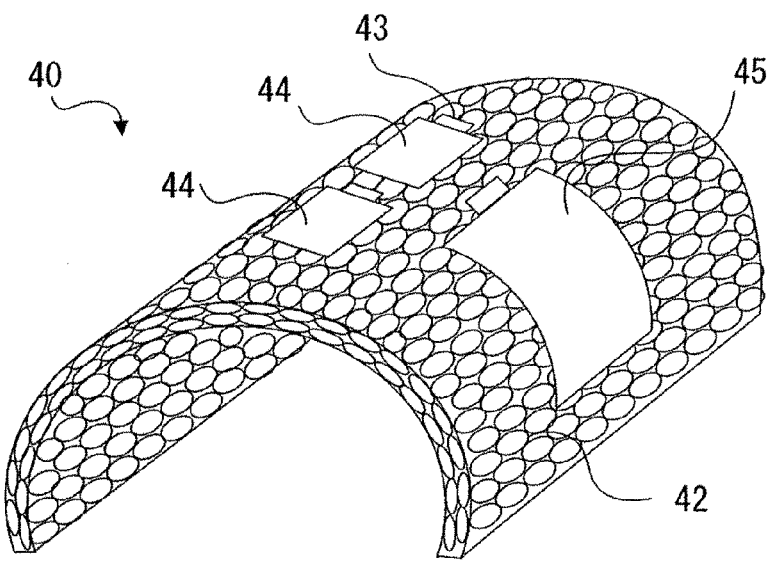
FIG. 3 is a structural diagram describing a third exemplary embodiment of the wiring structure of the present invention.

Next, one example of the whole structure according to a third exemplary embodiment of the present invention formed using a wiring structure shown in FIGS. 1A and 1D or FIGS. 2A to 2E will be described in detail. FIG. 3 is a structural diagram describing the third exemplary embodiment of a wiring structure according to the present invention, and shows a whole structure of a wiring structure of semi-cylindrical shape.

One of the features of the third exemplary embodiment is that, as shown in FIG. 3, a wiring structure 40 that is formed into fabric has a curved shape. In other words, the wiring structure 40 according to the third exemplary embodiment is formed in semi-cylindrical shape.

The wiring structure 40 shown in FIG. 3 includes a braiding fabric 42 of semi-cylindrical shape in which a cable and a fiber 12 are braided, and a first module 44 and a second module 45 mounted on the braiding fabric 42. In the third exemplary embodiment, the first module 44 and the second module 45 are arranged in the side of the curved convex surface of the braiding fabric 42.

For example, as described with reference to FIGS. 2A to 2E, the sheath 39 of the signal cable 36 forming the braiding fabric 42 includes a cable holding part 310 and a fiber holding part 311, and the cable holding part 310 and the fiber holding part 311 are arranged at predetermined pitches. Similarly to the second exemplary embodiment, a predetermined cable bending radius can be secured by providing a cable allowable bending radius securing part 319. At the same time, by providing a marginal cable length securing part 320, the signal cable 36 that is organized by being braided may have a predetermined marginal length, thereby being capable of dealing with shrinkage or vibration of the wiring structure 40.

Note that, the intervals of the cable holding parts 310 or the intervals of the fiber holding parts 311 provided in the sheath 39 of the signal cable 36 are formed by the pitch that achieves the mesh size in consideration of the marginal cable length or the allowable bending radius of the signal cable 36. The signal cable 36 has the mesh with regular patterns, thereby being capable of keeping the high strength of the wiring structure 40, and satisfactory appearance of the wiring structure 10 can be maintained. In general, the thinner and the softer the cable is, the smaller the mesh size is.

In this way, the whole wiring structure 40 according to the third exemplary embodiment is formed in a semi-cylindrical shape, thereby capable of being attached while being closely connected to a human body, or the electrical equipment including a case of cylindrical shape, for example. A cable connector 43 is formed at each end of the signal cable 36 and the power supply cable 31 that are braided. A module having various shapes is connected to the cable connector 43. In FIG. 3, the first module 44 has a shape having a horizontal plane. Further, the second module 45 has a shape having a curved surface according to the wiring structure 40. Each module is attached and fixed to the braiding fabric 42 using adhesive or the like.

Also in the wiring structure 40 shown in FIG. 3, the signal cable 36 or the power supply cable 31 that is braided may be a single-core cable, a multi-core cable, a coaxial cable, and an optical cable. Further, in each type of cables, the sizes and the pitches of the cable holding part 310 and the fiber holding part 311 formed in the sheath 39 can be designed as desired. Further, the type or the length of the cable can be selected as desired according to the signal characteristics used in the wiring structure 40. Further, the material, the type, and the thickness of the fiber 12 forming the braiding fabric 42 can be selected as desired in consideration of a shrinkage ratio, texture, or environmental resistance or the like required for the wiring structure 40. Further, the signal cable 36, the power supply cable 31, and the fiber 12 may be braided by hand or by a braiding machine. A predetermined three-dimensional shape is achieved according to the braiding process described above.

The shape of the wiring structure 40 is not limited to the semi-cylindrical shape, but various complicated shapes can be achieved according to the way of braiding the signal cable 36 or the power supply cable 31. In this way, by using the wiring structure 40 according to the third exemplary embodiment, a wiring structure having a complicated shape can be formed, thereby being capable of easily forming the wiring part with complicated form required for the electrical equipment or the like including wearable appliance or a curved surface case. Further, when the electrical equipment is discarded, the signal cable 36, the power supply cable 31, and the fiber 12 forming the wiring structure 40 are raveled, thereby capable of easily reusing the signal cable 36, the power supply cable 31, and the fiber 12.

Structural Example of Fourth Exemplary Embodiment of the Present Invention

Figure 4:
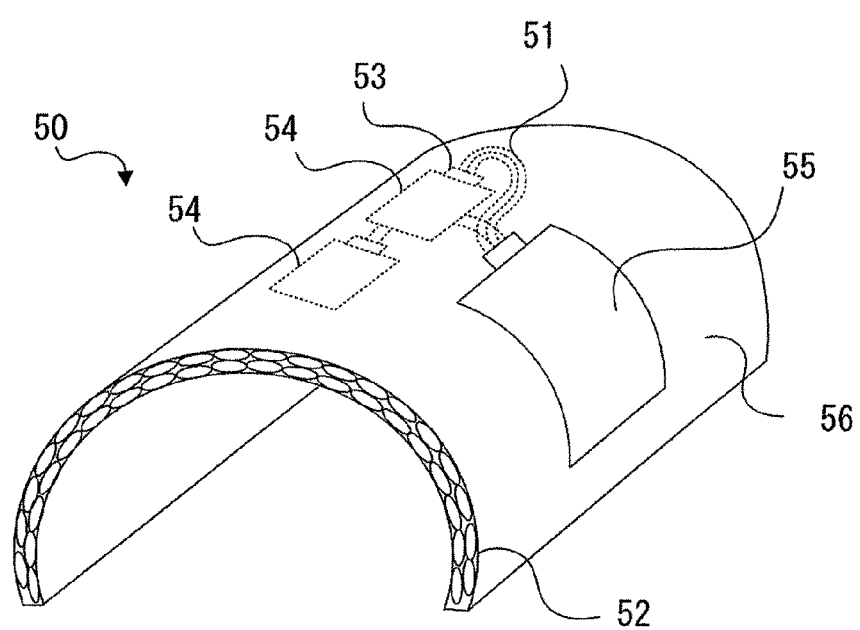
FIG. 4 is a structural diagram describing a fourth exemplary embodiment of the wiring structure of the present invention.

Next, another example of the structure according to a fourth exemplary embodiment of the present invention that is different from FIG. 3 of the whole structure formed using the wiring structure shown in FIGS. 1A and 1D, or FIGS. 2A to 2E will be described in detail. FIG. 4 is a structural diagram describing the fourth exemplary embodiment of a wiring structure according to the present invention, and shows the whole structure of the wiring structure having a semi-cylindrical shape, as is similar to FIG. 3.

However, the fourth exemplary embodiment shown in FIG. 4 is different from the third exemplary embodiment shown in FIG. 3 in that the front surface of the braiding fabric 52 or the front surface of the wiring structure 50 is fixed by being integrally formed by resin 56, thereby achieving a rigid wiring structure. Although resin 5 is formed on each of the front surfaces in the convex surface and the concave surface of the wiring structure 50, the resin 56 may be formed in one of the two surfaces.

In the fourth exemplary embodiment, among the first module 54 and the second module 55 mounted on the wiring structure 50, only the first module 54 is embedded in the braiding fabric 52. Specifically, the first module shown by a dotted line in FIG. 4 is arranged between a concave surface of the braiding fabric 52 and the resin 56. Alternatively, the first module shown by a dotted line in FIG. 4 is arranged between a convex surface of the braiding fabric 52 and the resin 56. In this way, by forming the resin 56 on the front surface of the wiring structure 50, a rigid wiring structure 50 can be manufactured. Accordingly, a shape retaining property as the wiring structure can be improved. Further, by embedding the module between the braiding fabric 52 and the resin 56, the position of the module can be fixed to a predetermined position.

Structural Example of Fifth Exemplary Embodiment of the Present Invention

Figure 5:
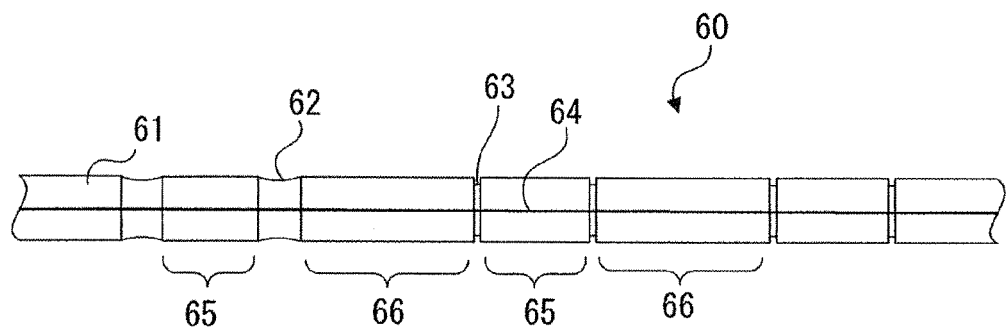
FIG. 5 is a structural diagram describing a fifth exemplary embodiment of the wiring structure of the present invention.
Figure 6:
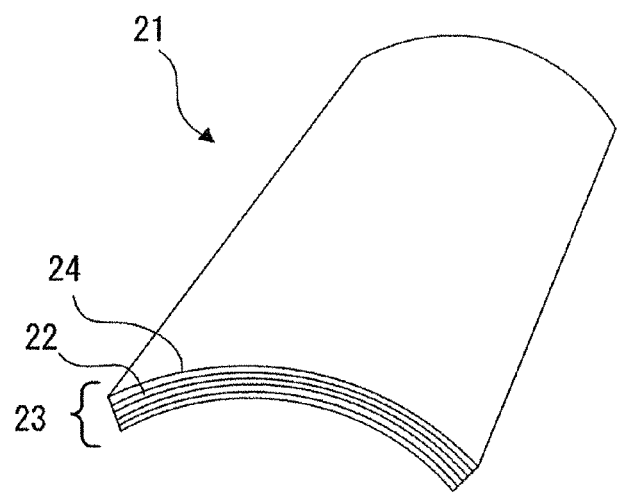
FIG. 6 is a structural diagram showing a whole structure of a curved printed wiring board according to a related art.

Next, another example of the structure according to a fifth exemplary embodiment of the present invention that is further different from FIGS. 1A and 1D, and FIGS. 2A to 2E of the signal cable forming the wiring structure according to the present invention will be described in detail. FIG. 5 is a structural diagram describing the fifth exemplary embodiment of a wiring structure of the present invention, and shows a cross-sectional view of a signal cable forming the wiring structure.

A cable 60 shown in FIG. 5 is a single-core cable including a core wire 64 formed of an electric wire, and a sheath 61 formed in the outer periphery of the core wire 64. A plurality of cable holding parts 62 and a fiber holding part 63 are formed in independent positions in the sheath 61 at predetermined intervals. When the cable holding part 62 engages with another signal cable 60, the cable holding parts 62 fit each other, thereby clamping the cables 60.

Further, when the cable 60 engages with the fiber, the fiber enters (bites into) the fiber holding part 63. Accordingly, the fiber holding part 63 is able to control the contact position of the cable 60 and the fiber, and clamp the fiber to the cable 60. Further, the cable 60 includes a cable allowable bending radius securing part 65 and a marginal cable length securing part 66. The cable holding part 62 and the fiber holding part 63 are formed by the cable allowable bending radius securing part 65 and the marginal cable length securing part 66 on the sheath 19 of the cable 18 at predetermined pitches in consideration of the cable allowable bending radius and the marginal cable length after organization.

The cable structure according to the fifth exemplary embodiment shown in FIG. 5 is different from the wiring structures according to the first and second exemplary embodiments described above in that the cable holding part 62 and the fiber holding part 63 are formed in different desired positions each other. This make it possible to separate the part in which the cables 60 are fit from the part in which the cable 60 and the fiber are fit.

Described above is the exemplary embodiments of the wiring structure according to the present invention. As described above, a method of manufacturing a wiring structure of the present invention at least includes the steps of:

braiding one or a plurality of cables and a fiber into a three-dimensional shape by hand or by using a braiding machine;

aligning ends of the cable that is braided to form a cable connector for module connection in the ends;

connecting a module to the cable connector that is formed; and fixing the module that is connected.

Further, the method of manufacturing the wiring structure according to the present invention may include a step of fixing a whole front surface of the wiring structure with resin after fixing the module that is connected.

The form of the wiring structure according to the present invention is not limited to the exemplary embodiments described above, but may be selected as appropriate according to the specification required by electrical equipment employing the wiring structure according to the present invention. Further, the wiring structure according to the present invention may be formed by braiding only a plurality of cables. Further, the structure of the mesh may be selected as desired.

The first problem in the related art is occurrence of wiring disconnection, short-circuit, cracking of a printed wiring board or the like due to the application of stress to a printed wiring board in a process of curving the printed wiring board. Such a problem becomes more serious with increasing size of the printed wiring board and with increasing curving angle.

The second problem in the related art is that, by curving the printed wiring board, the positional relation of the ground with respect to the signal wiring pattern formed to have a wiring width in the printed wiring board is changed, resulting in varied characteristic impedance of the signal wiring and occurrence of inconsistency. Such a problem becomes more serious in the curved shape not only between the printed wiring boards but also in the difference in the position in the printed wiring board.

The third problem in the related art is that, when the printed wiring board is curved using a die, each printed wiring board having a desired curved shape requires different dies. Further, it is difficult to manufacture a printed wiring board having a complicated shape in terms of the process of manufacturing the dies.

The first advantageous effect of the present invention is as follows. The wiring structure according to the present invention is capable of dealing with complicated shapes. Further, since the cable wiring having a predetermined marginal length follows external factors including vibration and expansion and contraction of the wiring structure, the wiring structure having a desired three-dimensional shape with high wiring connection reliability can be manufactured.

The second advantageous effect of the present invention is as follows. By using the wiring structure according to the present invention, the cable is braided in a state in which an allowable bending radius is secured. Thus, the deformation of the shape of the wiring structure does not influence characteristic impedance of the signal wiring, thereby being capable of manufacturing the wiring structure that enables signal wiring connection with high quality.

The third advantageous effect of the present invention is as follows. By using the wiring structure according to the present invention, when the electrical equipment is discarded, the cable and the fiber forming the wiring structure is raveled, thereby capable of easily reusing the cable and the fiber.

The fourth advantageous effect of the present invention is as follows. By using the wiring structure according to the present invention, even after the shape of the wiring structure is deformed, it can be easily restored to the original shape.

The fifth advantageous effect of the present invention is as follows. By using the wiring structure according to the present invention, assembling or exchange of modules embedded in the wiring structure can be easily performed.

Described above is the configurations of the preferred exemplary embodiments of the present invention. Note that, however, these exemplary embodiments are merely examples of the present invention, and are not intended to limit the present invention. A person skilled in the art would easily understand that various changes can be made according to the specific application without departing from the spirit of the present invention. For example, the exemplary aspects of the present invention can be expressed as the following configurations in addition to the configuration (1) described in Solution to Problem.

(2) The wiring structure according to (1), in which the cable forms a mesh to relay the fiber.

(3) The wiring structure according to (1), in which the cable forms a mesh with the fiber.

(4) The wiring structure according to any one of (1) to (3), in which a mesh size for braiding the cable and the fiber is formed to have the same size or a plurality of kinds of sizes.

(5) The wiring structure according to any one of (1) to (4), in which the module has a shape deformed according to the shape of the wiring structure.

(6) The wiring structure according to any one of (1) to (5), in which a front surface of the wiring structure that is three-dimensionally formed is integrally formed by resin.

(7) The wiring structure according to any one of (1) to (6), in which one or a plurality of cable holding parts for holding another cable and one or a plurality of fiber holding parts for holding the fiber are formed at predetermined pitches in the same place in a sheath of the cable.

(8) The wiring structure according to any one of (1) to (6), in which one or a plurality of fiber holding parts for holding the fiber are formed at predetermined pitches in the sheath of the cable.

(9) The wiring structure according to any one of (1) to (6), in which one or a plurality of cable holding parts for holding another cable and one or a plurality of fiber holding parts for holding the fiber are each formed at predetermined pitches in the sheath of the cable.

(10) The wiring structure according to any one of (1) to (9), in which a type of the cable is one of a single-core cable, a multi-core cable, a coaxial cable, and an optical cable.

(11) The wiring structure according to any one of (1) to (10), in which a material, a type, and a thickness of the fiber is selected as desired according to at least environmental resistance, a shrinkage ratio, or texture of the wiring structure.

(12) The wiring structure according to any one of (1) to (11), in which the cable includes a plurality of cables, and the wiring structure is a structure obtained by braiding the plurality of cables instead of braiding the cable and the fiber.

(13) A cable for connecting modules, in which one or a plurality of cable holding parts for holding another cable and one or a plurality of fiber holding parts for holding a fiber organized by the cable and a mesh are formed at predetermined pitches in the same place in a sheath of the cable.

(14) A cable for connecting modules, in which one or a plurality of fiber holding parts for holding a fiber organized by the cable and a mesh are formed at predetermined pitches in a sheath of the cable.

(15) A cable for connecting modules, in which one or a plurality of cable holding parts for holding another cable and one or a plurality of fiber holding parts for holding a fiber organized by the cable and a mesh are each formed at predetermined pitches in a sheath of the cable.

(16) A method of manufacturing a wiring structure at least including the steps of: braiding one or a plurality of cables and a fiber into a predetermined three-dimensional shape by hand or by using a braiding machine; aligning ends of the cable that is braided to form a cable connector for module connection in the ends; connecting a module to the cable connector; and fixing the module.

(17) The method of manufacturing the wiring structure according to (16), further including a step of fixing a front surface of the wiring structure that is manufactured with resin after fixing the module.

Although the present invention has been described with reference to the exemplary embodiments, the present invention is not limited to the above description. Various changes that can be understood by a person skilled in the art may be made to the configurations and the details of the present invention within the scope of the present invention. Further, the present invention may be achieved by combining two or more exemplary embodiments described above.

This application claims the benefit of priority, and incorporates herein by reference in its entirety, the following Japanese Patent Application No. 2009-167587 filed on Jul. 16, 2009.

INDUSTRIAL APPLICABILITY

The present invention relates to a wiring structure, a cable, and a method of manufacturing the wiring structure, and more particularly, can be applied to a mounting structure of a wiring structure having a three-dimensional wiring structure, a cable, and a method of manufacturing the wiring structure used in electrical equipment including a mobile terminal, an information communication device or the like.

REFERENCE SIGNS LIST

10 WIRING STRUCTURE
12 FIBER
13 FIRST CABLE CONNECTOR
14 FRONT SURFACE MODULE
15 REAR SURFACE MODULE
17 SECOND CABLE CONNECTOR
18 CABLE
18a FIRST CABLE
18b SECOND CABLE
19 SHEATH
21 PRINTED WIRING BOARD
22 PREPREG
23 PREPREG LAMINATED BODY
24 METAL FOIL
30 WIRING STRUCTURE
31 POWER SUPPLY CABLE
31a FIRST POWER SUPPLY CABLE
31b SECOND POWER SUPPLY CABLE
33 SIGNAL CABLE CONNECTOR
34 POWER SUPPLY MODULE
35 FUNCTION MODULE
36 SIGNAL CABLE
37 POWER SUPPLY CABLE CONNECTOR
39 SHEATH
40 WIRING STRUCTURE
42 BRAIDING FABRIC
43 CABLE CONNECTOR
44 FIRST MODULE
45 SECOND MODULE
50 WIRING STRUCTURE
51 CABLE
52 BRAIDING FABRIC
53 CABLE CONNECTOR
54 FIRST MODULE
55 SECOND MODULE
56 RESIN
60 CABLE
61 SHEATH
62 CABLE HOLDING PART
63 FIBER HOLDING PART
64 CORE WIRE
65 CABLE ALLOWABLE BENDING RADIUS SECURING PART
66 MARGINAL CABLE LENGTH SECURING PART
110 CABLE HOLDING PART
111 FIBER HOLDING PART
112 CORE WIRE
113 CONNECTION PART BETWEEN CABLE AND FIBER
114 CONNECTION PART OF CABLES
115 CONNECTION PART OF CABLES AND FIBER
116 CABLE ALLOWABLE BENDING RADIUS SECURING PART
117 MARGINAL CABLE LENGTH SECURING PART
310 CABLE HOLDING PART
311 FIBER HOLDING PART
312 CORE WIRE
313 DIELECTRIC LAYER
314 SHIELD LAYER
317 CONNECTION PART BETWEEN CABLE AND FIBER
318 CONNECTION PART OF CABLES
319 CABLE ALLOWABLE BENDING RADIUS SECURING PART
320 MARGINAL CABLE LENGTH SECURING PART

The invention claimed is:
1. A wiring structure comprising:
one or a plurality of cables;
a fiber forming a mesh-like braiding fabric together with the cable;
a cable connector formed at an end part of the cable; and
a module connected to the cable connector, the module receiving or outputting a signal through the cable,
wherein the cable comprises one or a plurality of fiber holding parts for holding the fiber, and
wherein the fiber holding part includes a concave portion formed in a circumferential direction of the cable in a sheath of the cable to engage with the fiber when the cable and the fiber form the mesh-like braiding fabric.

2. The wiring structure according to claim 1, wherein
the cable comprises one or a plurality of cable holding parts for holding another cable, and
the cable holding part includes a concave portion formed in the circumferential direction of the cable in the sheath of the cable to engage with the another cable when the cable, the another cable and the fiber form the mesh-like braiding fabric.

3. The wiring structure according to claim 1, wherein
the cable comprises a cable allowable bending radius part and a marginal cable length securing part, the cable allowable bending radius part being a curved part when the cable is folded when the mesh-like braiding fabric is formed, the marginal cable length securing part being a linear part when the mesh-like braiding fabric is formed, and
the cable allowable bending radius parts and the cable marginal length securing parts are alternately formed.

4. The wiring structure according to claim 1, wherein the fiber comprises one of synthetic fiber, semi-synthetic fiber, regenerated fiber, inorganic fiber, natural fiber, or fiber obtained by synthesizing two or more fibers of them.

5. The wiring structure according to claim 1, wherein the cable forms a mesh to relay the fiber.

6. The wiring structure according to claim 1, wherein the cable forms a mesh with the fiber.

7. The wiring structure according to claim 1, wherein a mesh size for braiding the cable and the fiber is formed to have the same size or a plurality of kinds of sizes.

8. The wiring structure according to claim 1, wherein the module has a shape deformed according to the shape of the wiring structure.

9. The wiring structure according to claim 1, wherein a front surface of the wiring structure that is three-dimensionally formed is integrally formed by resin.

10. The wiring structure according to claim 1, wherein one or a plurality of cable holding parts for holding another cable and one or a plurality of fiber holding parts for holding the fiber are formed at predetermined pitches in a sheath of the cable.

11. The wiring structure according to claim 1, wherein one or a plurality of fiber holding parts for holding the fiber are formed at predetermined pitches in the sheath of the cable.

12. The wiring structure according to claim 1, wherein one or a plurality of cable holding parts for holding another cable and one or a plurality of fiber holding parts for holding the fiber are each formed at predetermined pitches in the sheath of the cable.

13. The wiring structure according to claim 1, wherein a type of the cable comprises one of a single-core cable, a multi-core cable, a coaxial cable, and an optical cable.

14. The wiring structure according to claim 1, wherein a material, a type, and a thickness of the fiber is selected as desired according to at least environmental resistance, a shrinkage ratio, or texture of the wiring structure.

15. The wiring structure according to claim 1, wherein the cable includes a plurality of cables, and the wiring structure comprises a structure obtained by braiding the plurality of cables instead of braiding the cable and the fiber.

16. A cable for connecting modules, comprising:
one or a plurality of cable holding parts including a concave portion for holding another cable, the concave portion being formed in a circumferential direction of the cable in a sheath of the cable; and
one or a plurality of fiber holding parts including a concave portion for holding a fiber organized by the cable and a mesh, the concave portion of the fiber holding part being formed in the circumferential direction of the cable in the sheath of the cable, the fiber holding parts being different from the cable holding parts,
wherein the cable holding part and the fiber holding part are formed at predetermined pitches in the sheath of the cable, and
wherein the fiber holding part is disposed in the cable holding part.

17. A method of manufacturing a wiring structure comprising:
braiding one or a plurality of cables and a fiber into a predetermined three-dimensional shape by hand or by using a braiding machine, the cable including one or a plurality of fiber holding parts for holding the fiber;
aligning an end of the cable that is braided to form a cable connector for module connection;
connecting a module to the cable connector; and
fixing the module,
wherein the fiber engages with a concave portion of the fiber holding part formed in a circumferential direction of the cable in a sheath of the cable.

18. The method of manufacturing the wiring structure according to claim 17, further comprising fixing a front surface of the wiring structure that is manufactured with resin after fixing the module.

19. The wiring structure according to claim 1, wherein the cable includes a cable holding part,
wherein the cable holding part includes a concave portion formed in the circumferential direction of the cable in the sheath of the cable to engage with an other cable when the cable, the other cable and the fiber form the mesh-like braiding fabric, and
wherein the concave portion of the fiber holding part is formed in the concave portion of the cable holding part.

* * * * *